(12) United States Patent
Huott et al.

(10) Patent No.: US 7,368,958 B2
(45) Date of Patent: *May 6, 2008

(54) METHODS AND SYSTEMS FOR LOCALLY GENERATING NON-INTEGRAL DIVIDED CLOCKS WITH CENTRALIZED STATE MACHINES

(75) Inventors: William V. Huott, Holmes, NY (US); Charlie C. Hwang, Hopewell Junction, NY (US); Timothy G. McNamara, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/419,224

(22) Filed: May 19, 2006

(65) Prior Publication Data

US 2007/0176653 A1    Aug. 2, 2007

Related U.S. Application Data

(63) Continuation-in-part of application No. 11/341,038, filed on Jan. 27, 2006, and a continuation-in-part of application No. 11/341,032, filed on Jan. 27, 2006.

(51) Int. Cl.
*H03K 21/00* (2006.01)
(52) U.S. Cl. .................. 327/115; 327/117; 327/291; 377/48
(58) Field of Classification Search ............ 327/115, 327/117, 291–299; 377/47–48
See application file for complete search history.

(56) References Cited

U.S. PATENT DOCUMENTS

| 5,416,443 | A | 5/1995 | Cranford, Jr. et al. ......... 331/2 |
| 5,596,765 | A | 1/1997 | Baum et al. ................ 395/800 |
| 5,926,053 | A * | 7/1999 | McDermott et al. ........ 327/298 |
| 6,134,670 | A | 10/2000 | Mahalingaiah ............. 713/401 |
| 6,272,646 | B1 | 8/2001 | Rangasayee ............... 713/500 |
| 6,326,812 | B1 | 12/2001 | Jefferson .................... 326/93 |
| 6,550,013 | B1 | 4/2003 | Gervais et al. ............ 713/501 |
| 6,583,648 | B1 | 6/2003 | Cai ............................. 326/93 |
| 6,611,920 | B1 | 8/2003 | Fletcher et al. ............ 713/322 |
| 7,262,644 | B2 * | 8/2007 | Lin ........................... 327/113 |

OTHER PUBLICATIONS

Japanese Patent, "Patent Abstracts of Japan", (C) 1994, JPO & Japio.

* cited by examiner

*Primary Examiner*—N. Drew Richards
*Assistant Examiner*—William Hernandez
(74) *Attorney, Agent, or Firm*—Cantor Colburn LLP; Lynn Augspurger

(57) ABSTRACT

A method for locally generating a ratio clock on a chip includes generating a global clock signal having a global clock cycle. A centralized state machine includes a counter going through a complete cycle in response to a non-integer number of global clock cycles, the state machine generating a control signal in response to the counter. The control signal is provided to staging latches, the staging latches generating a clock high signal and a clock low signal. Local pass gates generate an (n+0.5)-to-1 clock signal in response to the global clock signal, the clock high signal and the clock low signal.

12 Claims, 19 Drawing Sheets

CENTRALIZED STATE MACHINE

CENTRALIZED STATE MACHINE AND STAGING LATCHES

PARTIALLY CENTRALIZED STAGING LATCHES

PARTIALLY CENTRALIZED STATE MACHINE AND STAGING LATCHES

PARTIALLY CENTRALIZED STATE MACHINE AND STAGING LATCHES
WITH A HIERARCHY

PARTIALLY CENTRALIZED STATE MACHINE

CENTRALIZED STATE MACHINES

CONNECTION BETWEEN CENTRALIZED STATE MACHINE AND LOCAL STAGING LATCHES AND LOGIC

STAGING LATCHES AND LOGIC (LOCAL OR CENTRALIZED)

PASSGATES (LOCAL AT CLOCK GENERATION CIRCUIT)

1.5-to-1 clock, achievable dutycycle

Determine clkl and clkh

Determine relationship between clkl and clkh
determine control signal

STAGING LATCHES AND LOGIC FOR 1.5-TO-1 CLOCK GENERATION

PROGRAMMABLE RATIO CLOCK GENERATION CIRCUIT 33.3% DUTY CYCLE 1.5-to-1 CLOCK 1.5-to-1 CLOCK WITH 3 STAGING LATCHES 1.5-to-1 CLOCK WITH 2 STAGING LATCHES
ASSUMING ONLY FALLING EDGE OF THE CLOCK IS CRITICAL

METHODS AND SYSTEMS FOR LOCALLY GENERATING NON-INTEGRAL DIVIDED CLOCKS WITH CENTRALIZED STATE MACHINES

CROSS-REFERENCE TO RELATED APPLICATIONS

This application is a continuation-in-part of U.S. patent application Ser. No. 11/341,038, the entire contents of which are incorporated herein by reference, and is a continuation-in-part of U.S. patent application Ser. No. 11/341,032, the entire contents of which are incorporated herein by reference.

BACKGROUND OF THE INVENTION

1. Field of the Invention

This invention relates to generating a ratio clock signal using a global clock signal. More particularly, this invention relates to generating a ratio clock signal at any integer divided by two of a global clock signal.

2. Description of Background

It is common for an integrated circuit chip (chip) to operate with multiple different clock speeds. Often, chip architecture allows different regions of the chip to have different clock speeds. To achieve multiple different clock speeds, a chip may employ multiple clock grids throughout the entire chip with each clock grid producing a distinct clock speed. However, employing multiple clock grids creates additional expense for chip production. Higher clock skews between clocks of different clock grids may reduce the maximum clock speed and reduce chip performance. Thus, to keep costs down and keep chip performance up, it has been common practice to use a single clock grid to generate a global clock and obtain different clock speeds by developing ratio clock speeds at a specific ratio to the global clock.

It is common to use external control signals to develop derivative clock speeds at a ratio to the global clock. Additionally, absent external control signals, derivative clock speeds are generally limited to having whole number ratios to the global clock of, for example, 2-to-1, 4-to-1, etc. Generally, there is known in the art circuits which centrally generate clocks with multiple frequencies or phases with multiple phase locked loops, and which use an integral divider. Additionally, complex circuits used to generate derivative clock speeds may create a time delay between the global clock and the derivative clock.

An existing solution is provided in U.S. patent application Ser. No. 11/056,024, the entire contents of which are incorporated herein by reference. This application describes a circuit and power device for a local state machine, which while well suited for its intended purpose, is primarily effective when there are only a few local circuits. However, there are embodiments where a high number of circuits use a non-integral divided clock locally. Thus, there is a need for a more compact solution than that described in U.S. patent application Ser. No. 11/056,024.

SUMMARY OF THE INVENTION

Embodiments include a method for locally generating a ratio clock on a chip, comprising: generating a global clock signal having a global clock cycle; providing a centralized state machine, the state machine including a counter going through a complete cycle in response to a non-integer number of global clock cycles, the state machine generating a control signal in response to the counter; providing the control signal to staging latches, the staging latches generating a clock high signal and a clock low signal, providing local pass gate for generating an (n+0.5)-to-1 clock signal in response to the global clock signal, the clock high signal and the clock low signal.

Embodiments further include a method for locally generating a ratio clock, comprising: generating a global clock signal having a global clock cycle; providing a centralized clock control unit including a first state machine and a second state machine, the first state machine including a counter going through a complete cycle in response to a non-integer number of global clock cycles, the first state machine generating a generating a clock high signal having a pattern corresponding to a target divided ratio clock when the global clock is high; the second state machine including a counter going through a complete cycle in response to a non-integer number of global clock cycles, the second state machine generating a generating a clock low signal having a pattern corresponding to the target divided ratio clock when the global clock is low; providing local pass gate for generating an (n+0.5)-to-1 clock signal in response to the global clock signal, the clock high signal and the clock low signal.

Embodiments further include circuitry for locally generating a ratio clock on a chip, comprising: circuitry for generating a global clock signal having a global clock cycle; a state machine including a counter going through a complete cycle in response to a non-integer number of global clock cycles, the state machine generating a control signal in response to the counter; staging latches receiving the control signal and generating a clock high signal and a clock low signal; a local pass gate receiving the clock low signal and the clock high signal and generating an (n+0.5)-to-1 clock signal in response to the global clock signal, the clock high signal and the clock low signal.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution which centralizes or partially centralizes one or more state machines to provide a method of generating ratio clocks while reducing circuitry used at the local circuit level. Further, staging latches may be centralized or partially centralized to reduce circuitry used at the local circuit level. The frequency and duty cycle of a locally generated ratio clock may be dynamically changed by reconfiguring the central state machines.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
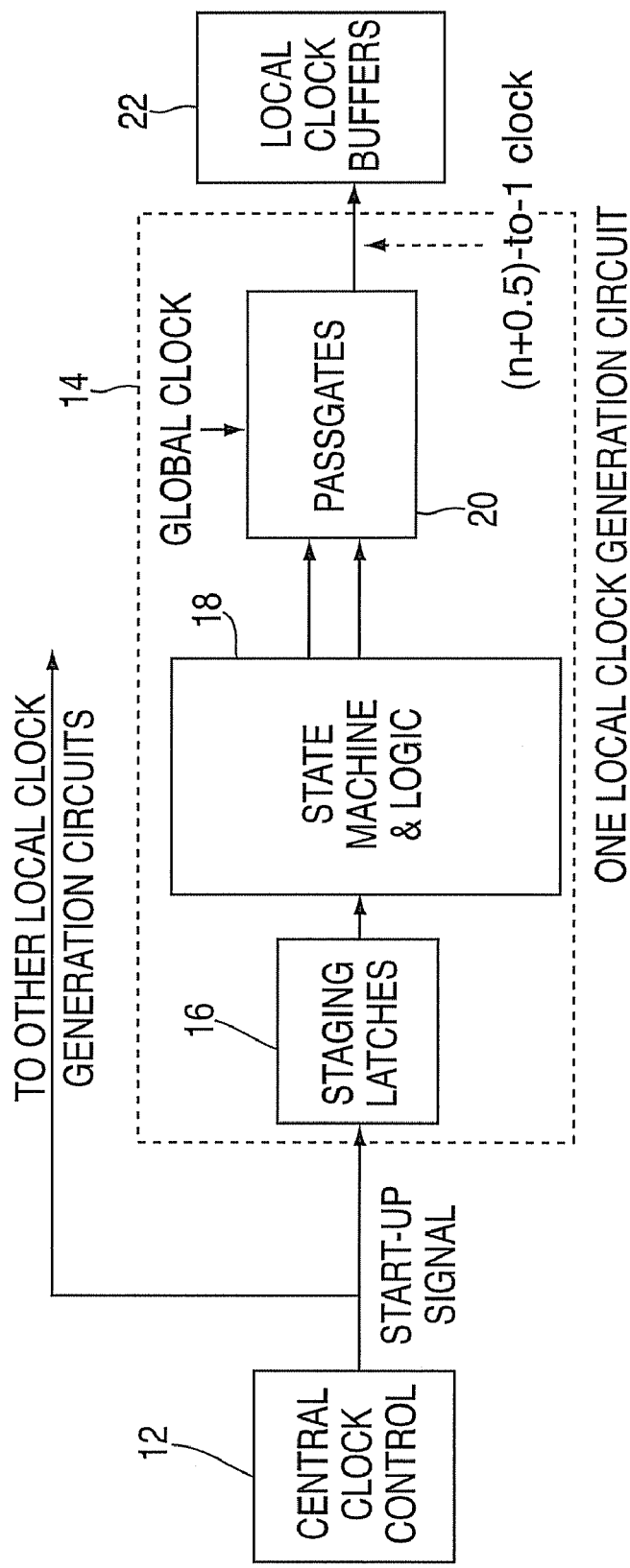
FIG. 1 illustrates a block diagram of an existing ratio clock generator.

FIG. 1 illustrates a block diagram of an existing ratio clock generator, such as that described in U.S. patent application Ser. No. 11/056,024. FIG. 1 shows a centralized clock control 12 that provides a start-up signal to a local clock generation circuit 14. The local clock generation circuit 14 includes staging latches 16, state machine and logic 18 and pass gates 20. The output of the pass gates 20 is the (n+0.5)-to-1 clock signal. Local clock buffers 22 store the clock signals for local devices.

The existing solution shown in FIG. 1 uses local state machines 18. The methods used in embodiments of the invention described with reference to FIGS. 2-7 centralize the state machine to allow sharing of the generally large state machine circuits among all clock generation circuits. As described herein, by centralizing the state machine, a more sophisticated state machine may be used with no or less impact on local circuit sizes.

Figure 2:
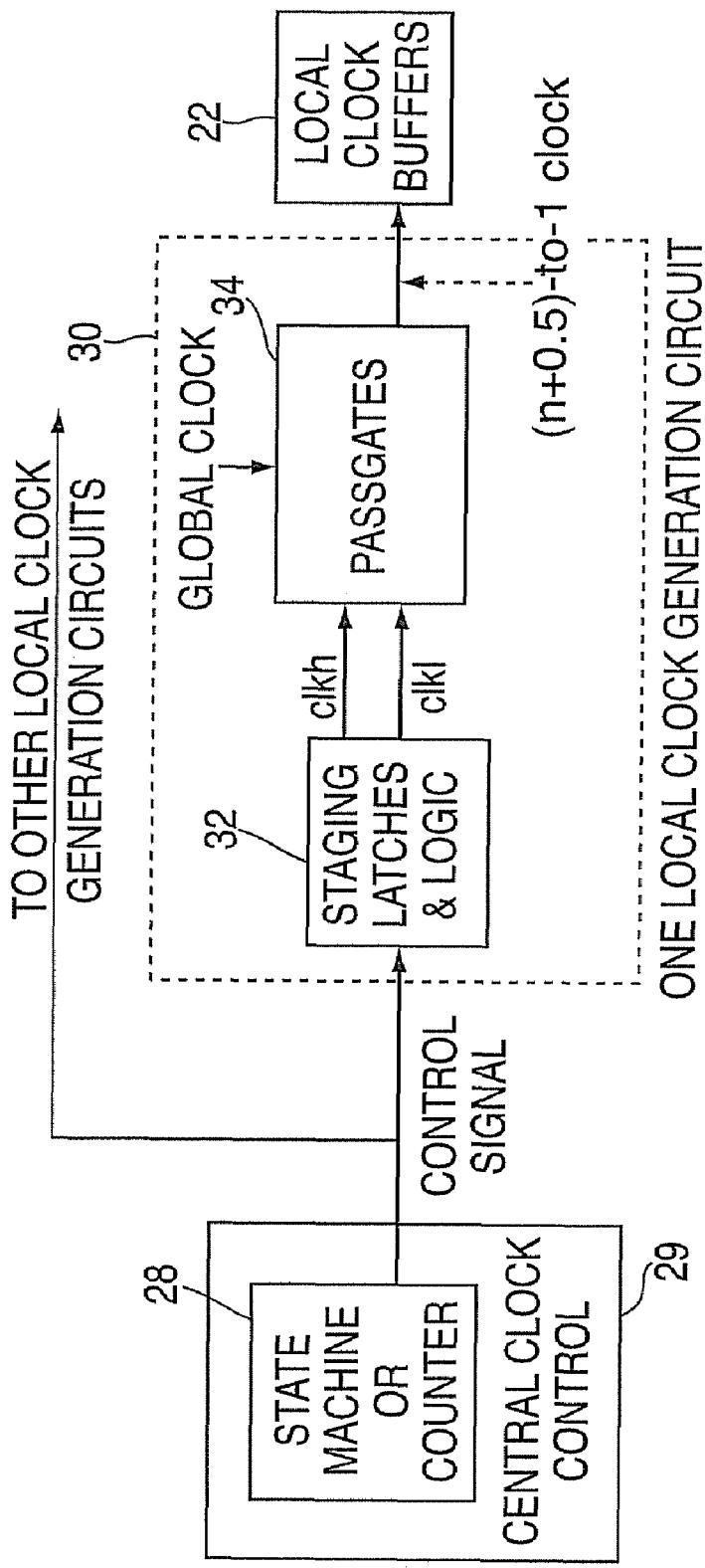
FIG. 2 illustrates one example of the method of centralizing the state machine part of the circuit to one central control unit of the chip.

FIG. 2 illustrates one example of the method of centralizing the state machine 28 of the circuit to one central control unit of the chip. The state machine 28 employs counters to increment logic states as described in U.S. patent application Ser. No. 11/056,024. In exemplary methods, the state machine creates a "count-to-three counter" that counts in binary, for example, 0, 1, 2, 0, 1, etc. The count-to-three counter passes through (counts) three incremental logic states twice during three complete clock cycles of a global clock. Therefore, the output of the count-to-three counter goes through a complete cycle every one and one-half global clock cycles (or a 1.5-to-1 ratio). In general, the control signal can have a non-integer number of cycles in response to a single global clock cycle.

Figure 13:
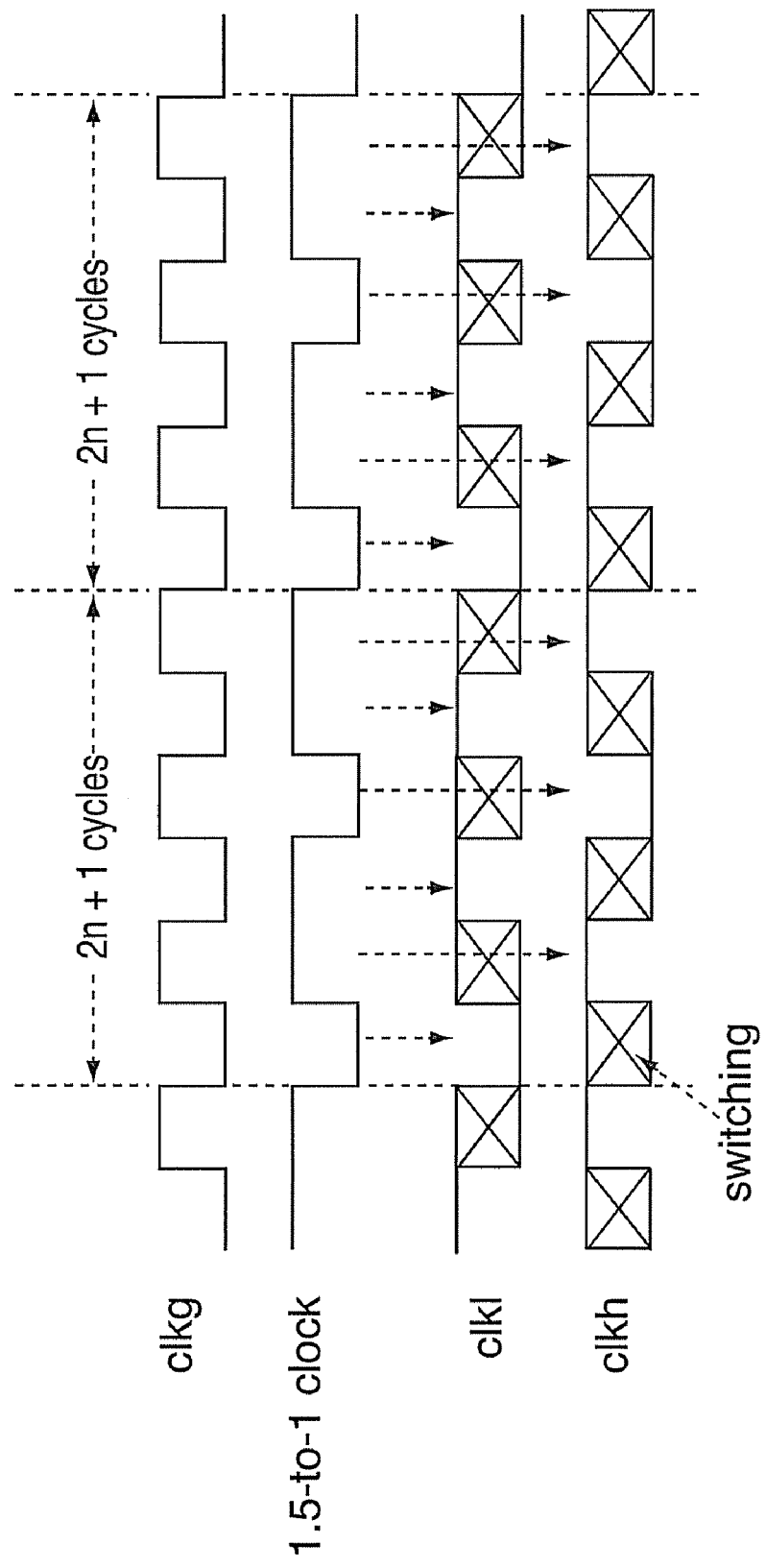
FIG. 13 illustrates one example of a method of determining required clkl and clkh pattern.

State machine 28 provides a control signal to a local clock generation circuit 30. As evident from FIG. 2, exemplary methods centralize the state machine 28, to provide less complex local circuits. The control signal from the centralized state machine 28 may be provided to multiple local clock generation circuits 30. Local clock generation circuit 30 includes staging latches and logic 32 that generate a clock high signal (clkh) and a clock low signal (clkl) as shown in FIG. 13. The staging latches 32 are used to synchronously capture the control signals and to work with the associated logic to generate target ratio clocks. The timing information (e.g., frequency, duty cycle) is carried by the control signals from the state machine.

FIG. 13 depicts the global clock signal clkg. The staging latches 32 operate to generate the clock high signal and the clock low signal, examples of which are shown in FIG. 13. As shown in FIG. 13, the clock high signal, clkh, is passed through the final passgate when clkg is high, while clock low signal, clkl, is passed through when clkg is low. The required pattern to generate clkh and clkl may be determined from the target frequency and duty cycle of the divided ratio clock. In the example shown in FIG. 13 for a 1.5-to-166.7% duty cycle ratio clock. The data pattern for clkl will be 011, while clkh will have 101. Both repeat every 3 cycles. Once clkl and clkh patterns are determined, any conventional logic design methods may be used to design the circuits for the central state machine and the logic in local clock generation circuits.

By using this method of determining clkh and clkl signals, theoretically a ratio clock with any waveform and duty cycle may be generated by generating corresponding clkl and clkh patterns.

The clock high signal and the clock low signal are provided to pass gates 34 to generate the (n+0.5)-to-1 clock signal. In the example shown in FIG. 13, the (n+0.5)-to-1 clock signal is a 1.5-to-1 clock signal. To generate the (n+0.5)-to-1 clock, the global clock signal is used by pass gates 34 to select either the clock high signal or the clock low signal in response to the state of the global clock signal. FIG. 13 depicts how the (n+0.5)-to-1 clock signal is formed from sections of the clock high signal clkh and clock low signal clkl. The (n+0.5)-to-1 clock signal is provided to local clock buffers 22. For circuits that are sensitive to sizes, the size of local clock generation circuit 30 may be reduced further by centralizing the staging latches 32 into central clock control unit 29.

Figure 3:
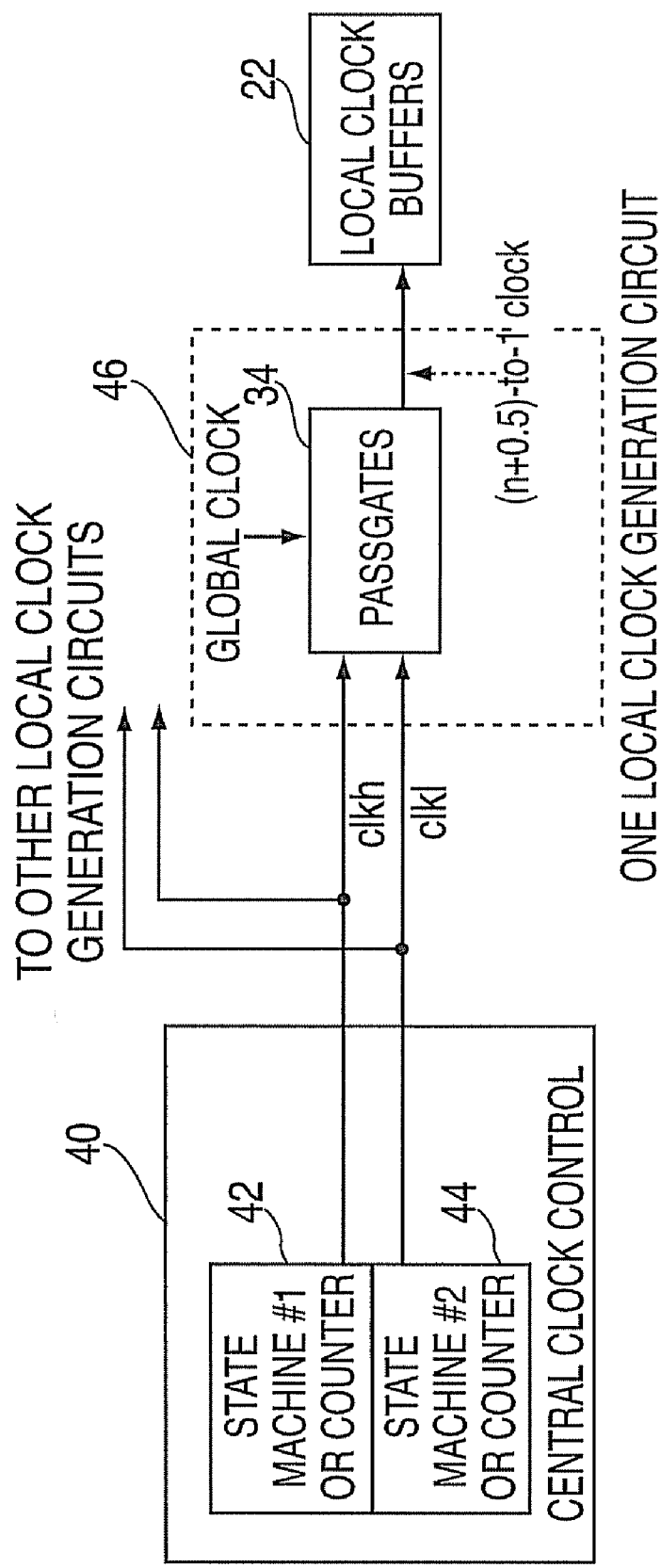
FIG. 3 illustrates one example of the method of completely centralizing the state machine and staging latches for the whole chip.

FIG. 3 illustrates an alternate method of generating the (n+0.5)-to-1 clock signal. In these methods, generation of the clock high signal clkh and the clock low signal clkl is centralized in two state machines 42 and 44. Two state machines 42 and 44 with individual configuration cooperate to generate two signal patterns, clkl, and clkh to achieve the desired ratio clock at the local circuit. This eliminates the need for staging latches in the local clock generation circuit 46 to reduce the size of the local clock generation circuitry.

The signal pattern of clkl and clkh may be dynamically reconfigured to achieve a different local ratio clock without changing local circuitry.

Figure 4:
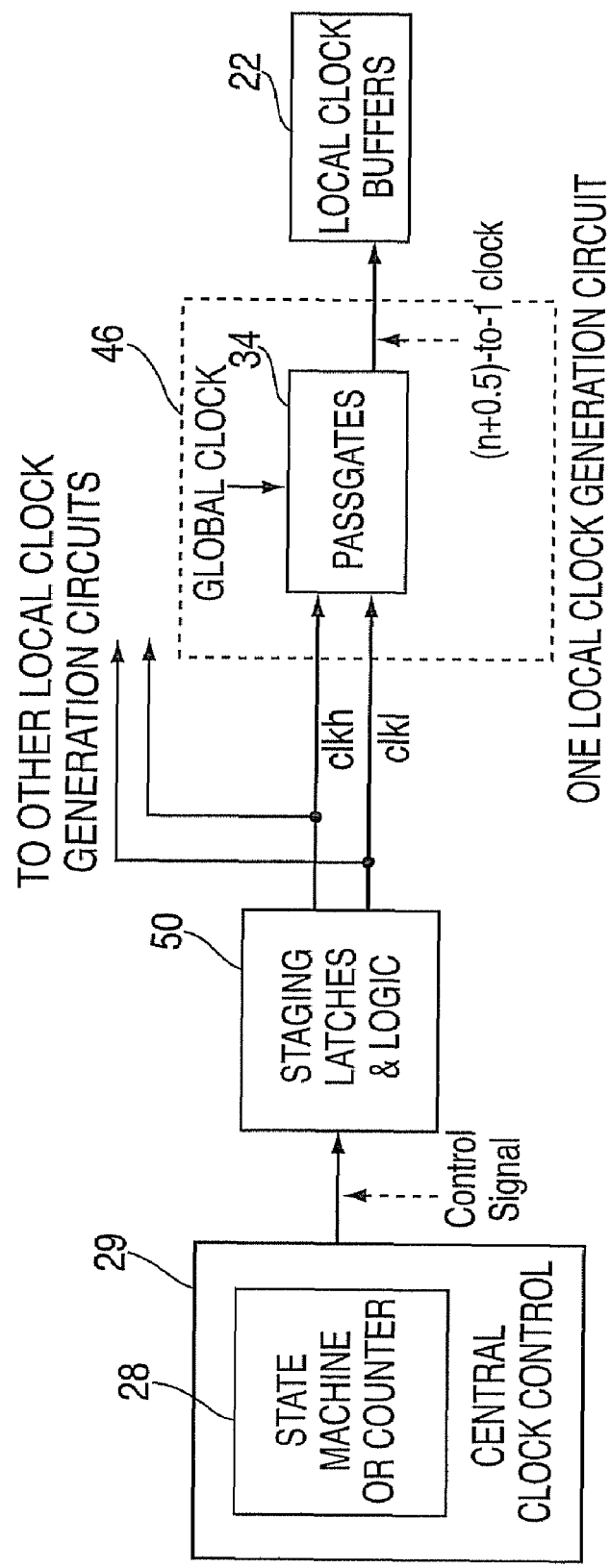
FIG. 4 illustrates one example of the method of completely centralizing the state machine and partially centralizing the staging latches.

FIG. 4 illustrates an alternate method of generating the (n+0.5)-to-1 clock signal. Instead of centralizing the state machines and staging latches completely, multiple copies of the staging latches 50 may be placed strategically on the chip between the central clock control 29 and local clock generation circuits 46 and shared by a group of clock generation circuits 46 to reduce the cost of distributing high speed control signals or the "clkl" & "clkl" signals. FIG. 4 shows the case that the state machine 28 is centralized but the staging latches and logic 50 are partially centralized. The staging latches 50 will serve local clock buffers of the same clock frequency.

Figure 5:
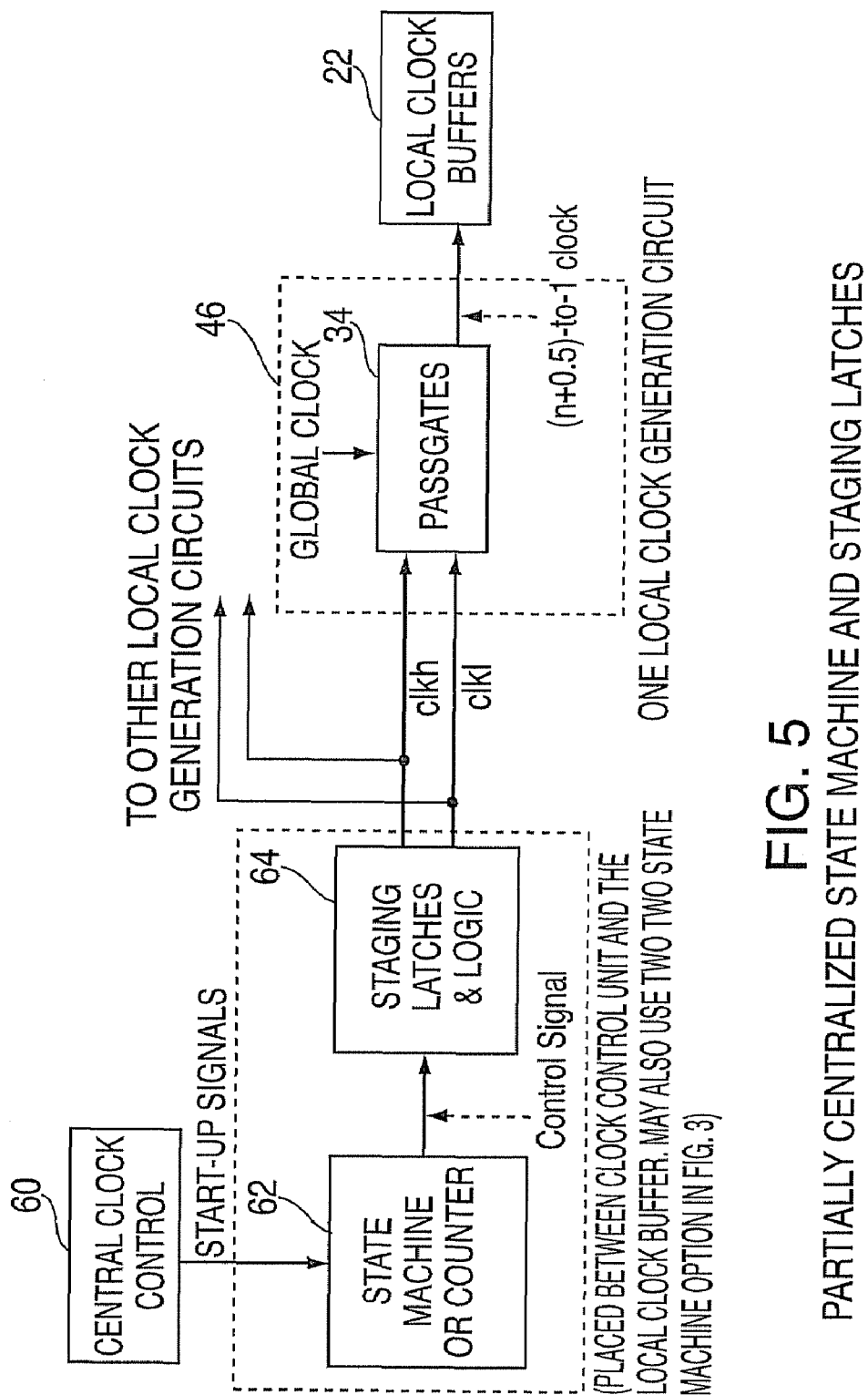
FIG. 5 illustrates one example of the method of partially centralizing state machines and staging latches.

FIG. 5 illustrates an alternate method of generating the (n+0.5)-to-1 clock signal. In FIG. 5, a centralized clock control 60 provides start-up signals to multiple copies of state machine 62 and staging latches 64. FIG. 5 shows the case that both state machine 62 and staging latches 64 are both partially centralized, meaning that multiple instances of the state machine 62 and staging latches 64 are provided on the chip. One set of state machine 62 and staging latches 64 may be used to serve a larger region on the chip.

Figure 6:
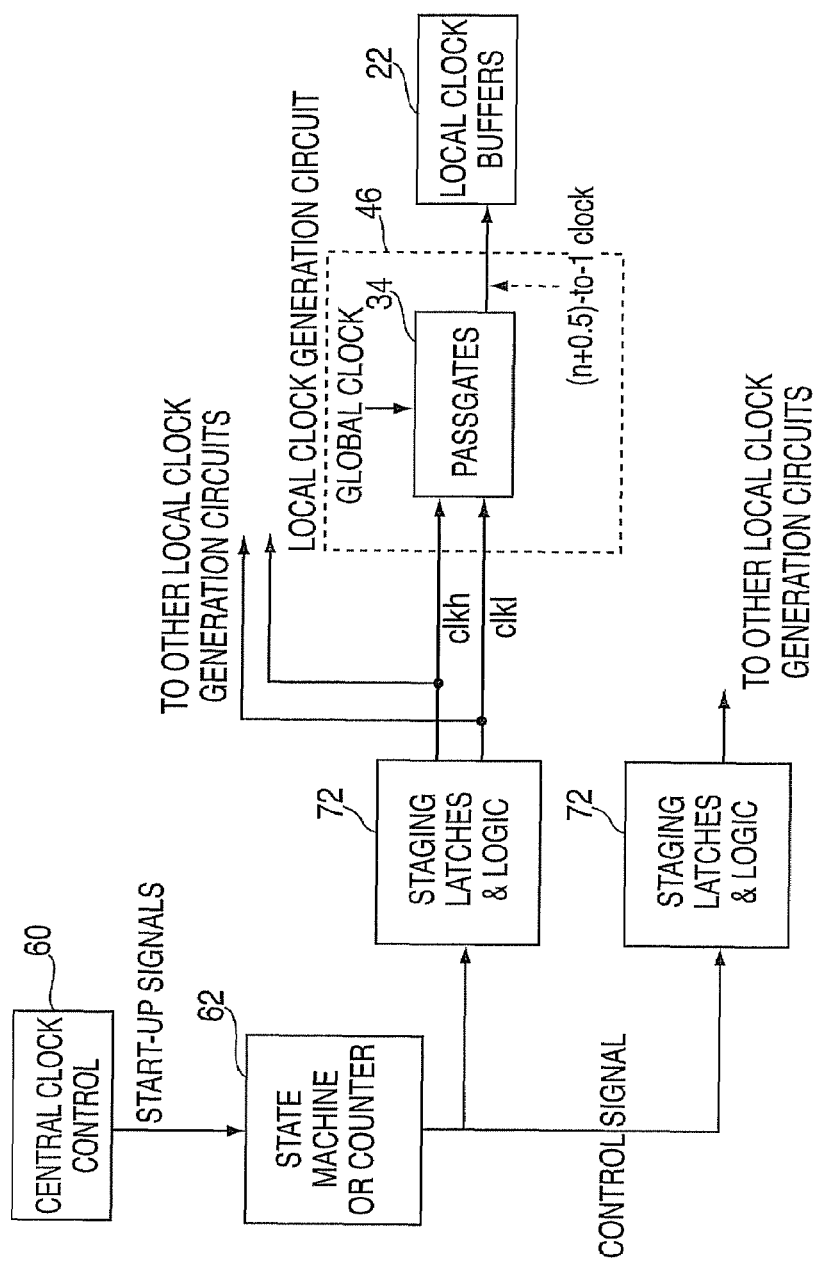
FIG. 6 illustrates one example of the method of hierarchically arranging partially centralized state machines and staging latches.

FIG. 6 illustrates an alternate method of generating the (n+0.5)-to-1 clock signal. As shown in FIG. 6, the state machine 62 and staging latches 72 may be separated to create a hierarchy. One state machine 62 may serve multiple staging latches 72 which may be at different locations. Again, as described with reference to FIG. 5, multiple state machines 62 may be used to cover different regions of the chip. Also, the staging latches 72 are associated with more than one local clock generation circuit 46 so that in general, there are more staging latches 72 than state machines 62.

Figure 7:
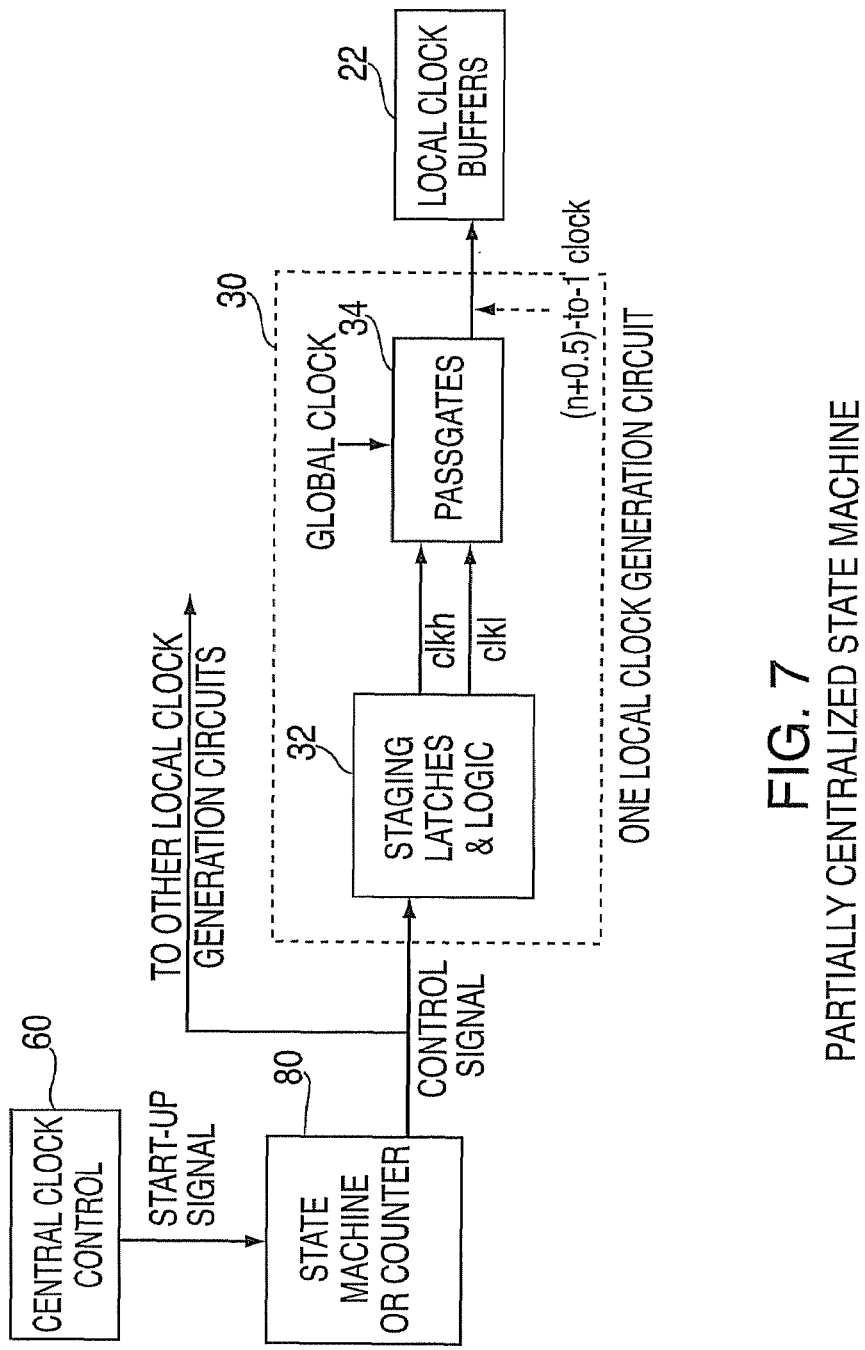
FIG. 7 illustrate one example of the method of only partially centralizing the state machine.

FIG. 7 illustrates an alternate method of generating the (n+0.5)-to-1 clock signal. In FIG. 7, the local clock generation circuits include staging latches 32 and pass gates 34 as described above. The state machine 80 that generate the control signal pattern may be the only component that is partially centralized such that multiple state machines are used to cover different regions of the chip.

FIGS. 2-7 depict various solutions, one of which may be selected depending on the amount and distribution of the circuits that need a particular (n+0.5)-to-1 clock. Trade-off among all possible solutions can be analyzed based on chip and macro floorplan. Some general guidelines are as follows.

A mixture of the various solutions depicted in FIGS. 2-7 may also be used by employing different solution for different regions of the chip depending on the nature of each region and amount local clock generation circuits used.

For higher n, (e.g., n=2 and above), it will beneficial to either completely or partially centralize the state machine and staging latches since the required number of latches for both the state machine and the staging latches is proportional to n. If the circuits that required (n+0.5)-to-1 clock are localized in one area, it may be better to have a partially centralized state machine and staging latches to save the cost of distributing high speed control signal across the chip. If the circuits that require (n+0.5)-to-1 clock are abundant and distributed over a large area of the chip, completely centralized state machines and staging latches may be best solution. If only a few circuits on a chip require (n+0.5)-to-1 clock, a localized state machine and staging latches may be the best solution.

Methods of the invention avoid a bulky local state machine and staging latches to achieve small and compact local clock generation circuit to improve area usage, timing, and power. Methods of the invention allow flexible control of frequency and duty cycle from centralized clock control unit.

Figure 8:
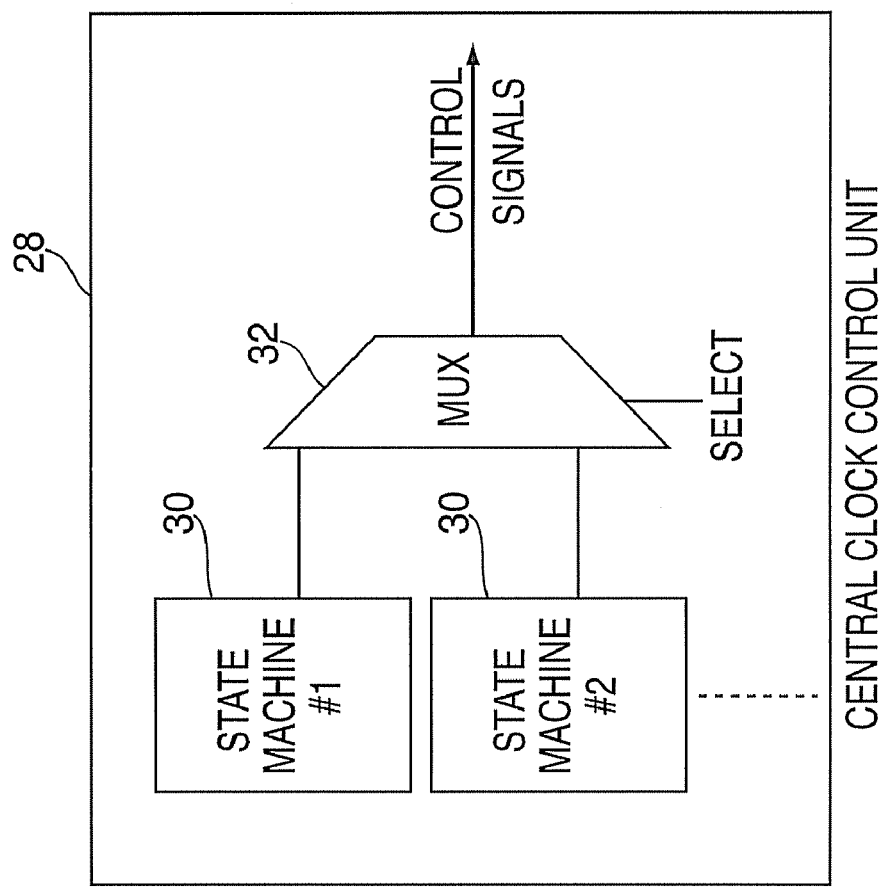
FIG. 8 illustrates one example of multiple state machines in the central control unit for control signal generation.

Circuits used to provide a ratio clock generator are now described with reference to FIGS. 8-19. FIG. 8 depicts centralized state machines 30 that generate clock control signals. The control signals are generated centrally from the centralized state machines 30 and may be reconfigurable from external controls. One example is to generate different control signal patterns from a clock control unit 28 using multiple state machines 30 and select control signal patterns through a multiplexer 32. The state machine 30 could be a simple counter or a counter with some logic depending on the control patterns required.

As described in co-pending application Ser. No. 11/056,024 the state machine 30 may employ counters to increment logic states as described in U.S. patent application Ser. No. 11/056,024. In exemplary methods, the state machine creates a "count-to-three counter" that counts in binary, for example, 0, 1, 2, 0, 1, etc. The count-to-three counter passes through (counts) three incremental logic states twice during three complete clock cycles of a global clock. Therefore, the output of the count-to-three counter goes through a complete cycle every one and one-half global clock cycles (or a 1.5-to-1 ratio). In general, the control signal can have a non-integer number of cycles in response to a single global clock cycle.

Figure 9:
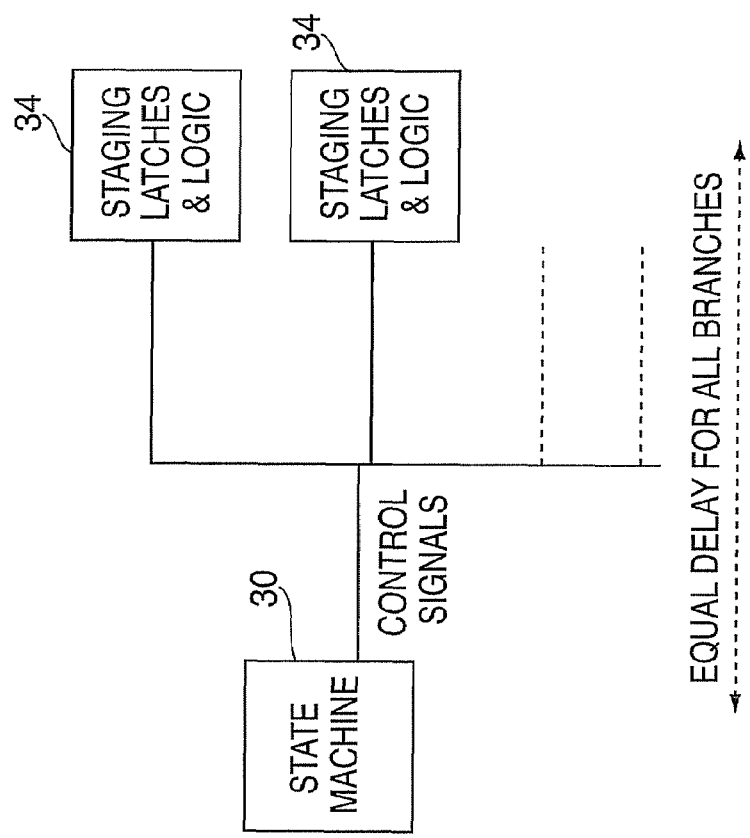
FIG. 9 illustrates a connection between a centralized state machine and local staging latches and logic.

FIG. 9 illustrates a connection between a centralized state machine 30 and local staging latches and logic 34 in alternate embodiments. The control signals sent from the state machine 30 are distributed through a tree like structure to the local staging latches and logic 34. The control signals are periodic patterns, which contain timing information. The delay is equalized between the state machine 30 and the staging latches and logic 34 for all branches so all staging latches and logic are synchronized properly.

Figure 10:
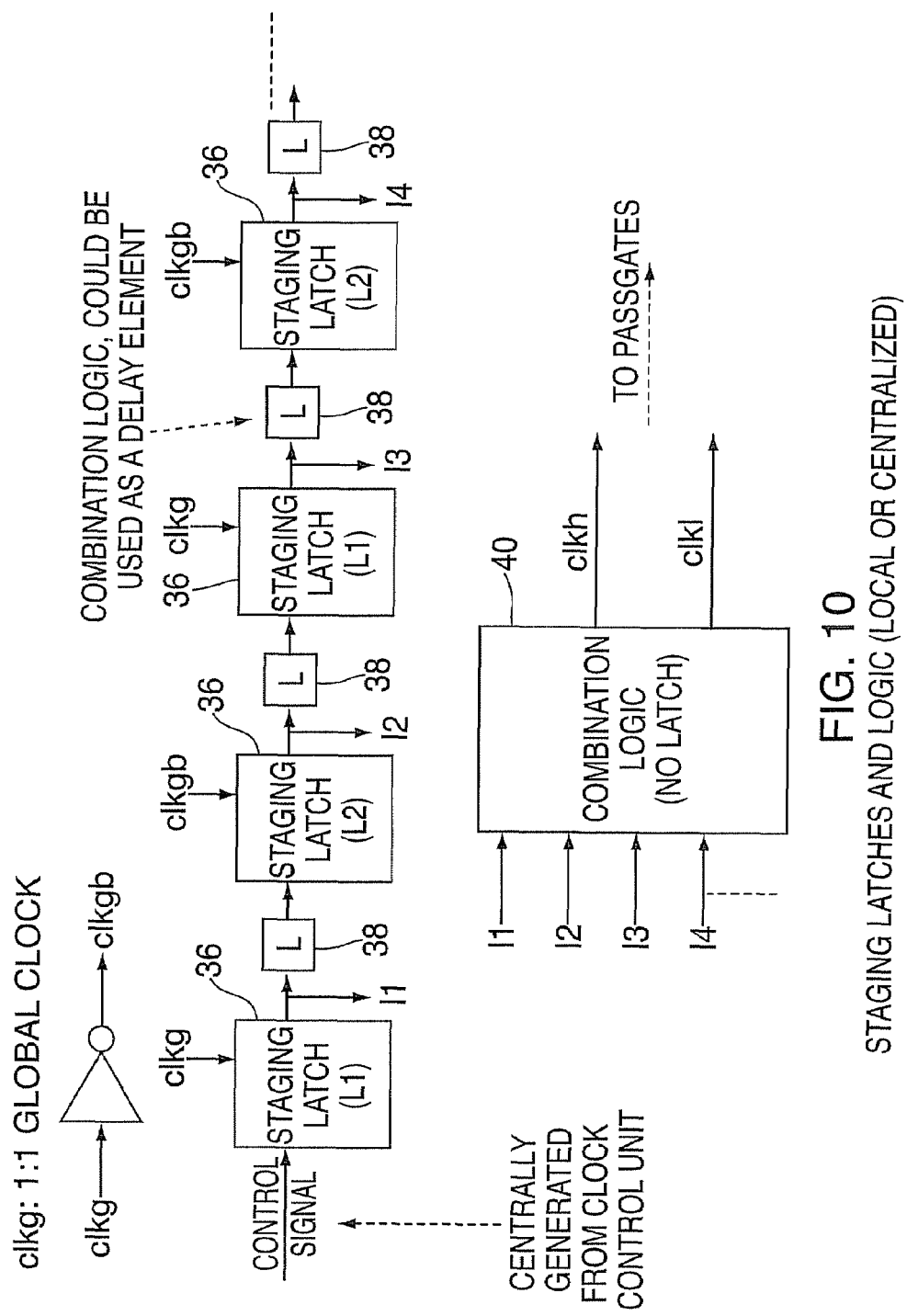
FIG. 10 illustrates one example of staging latches and logic for (n+0.5)-to-1 clock generation.
Figure 11:
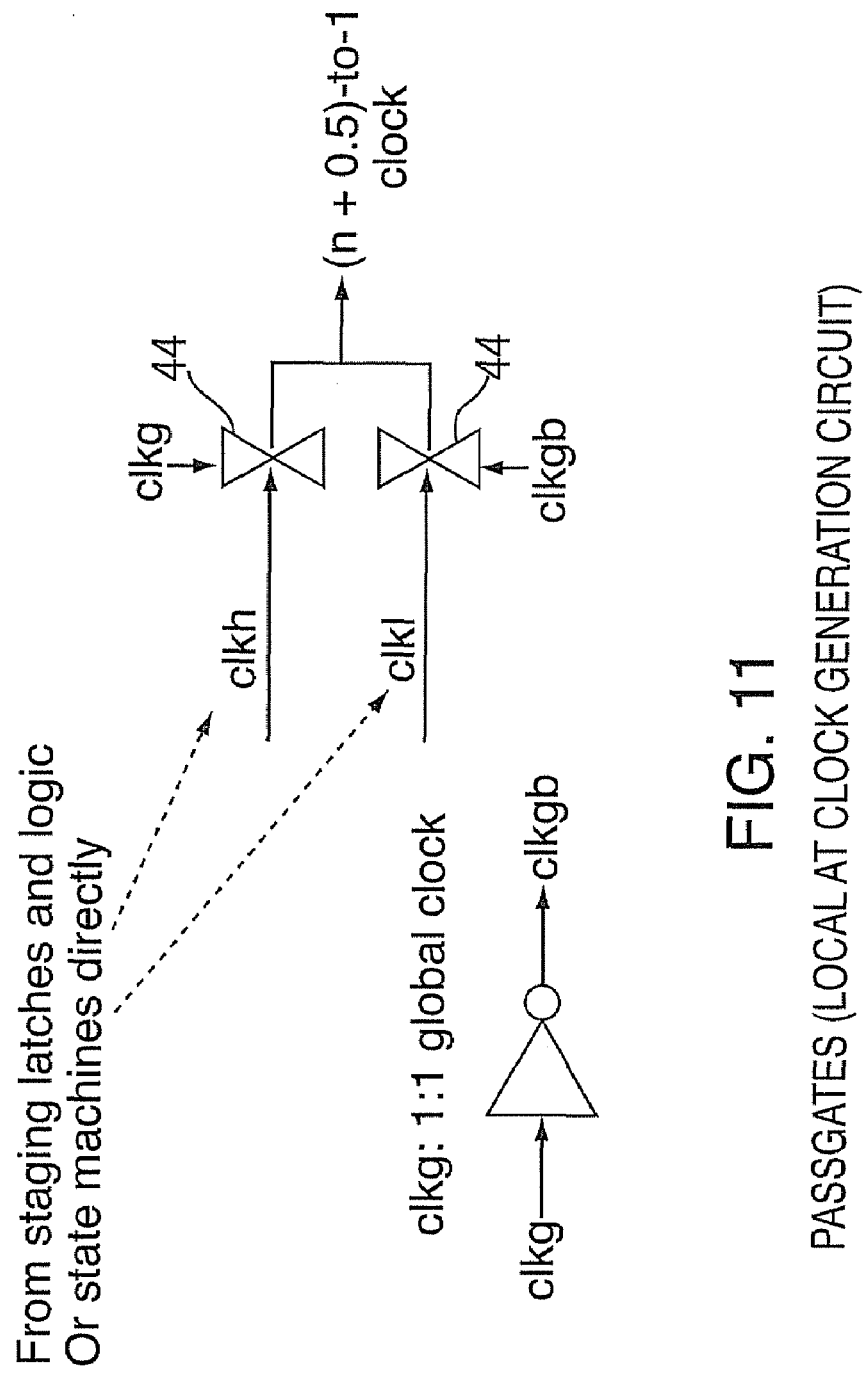
FIG. 11 illustrates one example of a local passgate circuit.

FIG. 10 illustrates one example of staging latches and logic for (n+0.5)-to-1 clock generation. The staging latches and logic comprised of one or multiple latches for generating delayed control signal of two phases, L1 and L2. A global clock signal clkg and inverted global clock signal clkgb are provided to gate the latches 36 to generate delayed control signals l1 . . . lN. The first staging latches 36 also serve the purpose of aligning the timing of the control signals. Combination logic 38 is positioned between each pair of connected latches 36. The combination logic 38 between latches 36 may be used to alter the control signal patterns. Alternatively, the combination logic 38 can simply pass through the control signals without alteration but serve as a delay element to prevent early-mode timing fails. A group combination logic 40 combines the delayed or altered control signals l1 . . . lN from all the latches 36 to generate the clock high signal (clkh) and clock low signal (clkl) to be sent to the passgates. The clock high signal (clkh) and clock low signal (clkl) have patterns derived from a waveform of a target divided ratio clock. The clock high signals and clock low signals have patterns that match the targeted divided clock frequency and duty cycle FIG. 11 illustrates one example of a local passgate circuit. The clock high signal clkh is passed through the passgates 44 when the global clock clkg is high as shown in FIG. 11. The clock low signal clkl is passed by passgates 44 when the global clock signal clkg is low as shown in FIG. 11. The global clock signal clkg is the 1:1 global clock, which is the reference of the generated ratio clock. The output of the passgates 44 is the (n+0.5)-to-1 ratio clock.

Figure 12:
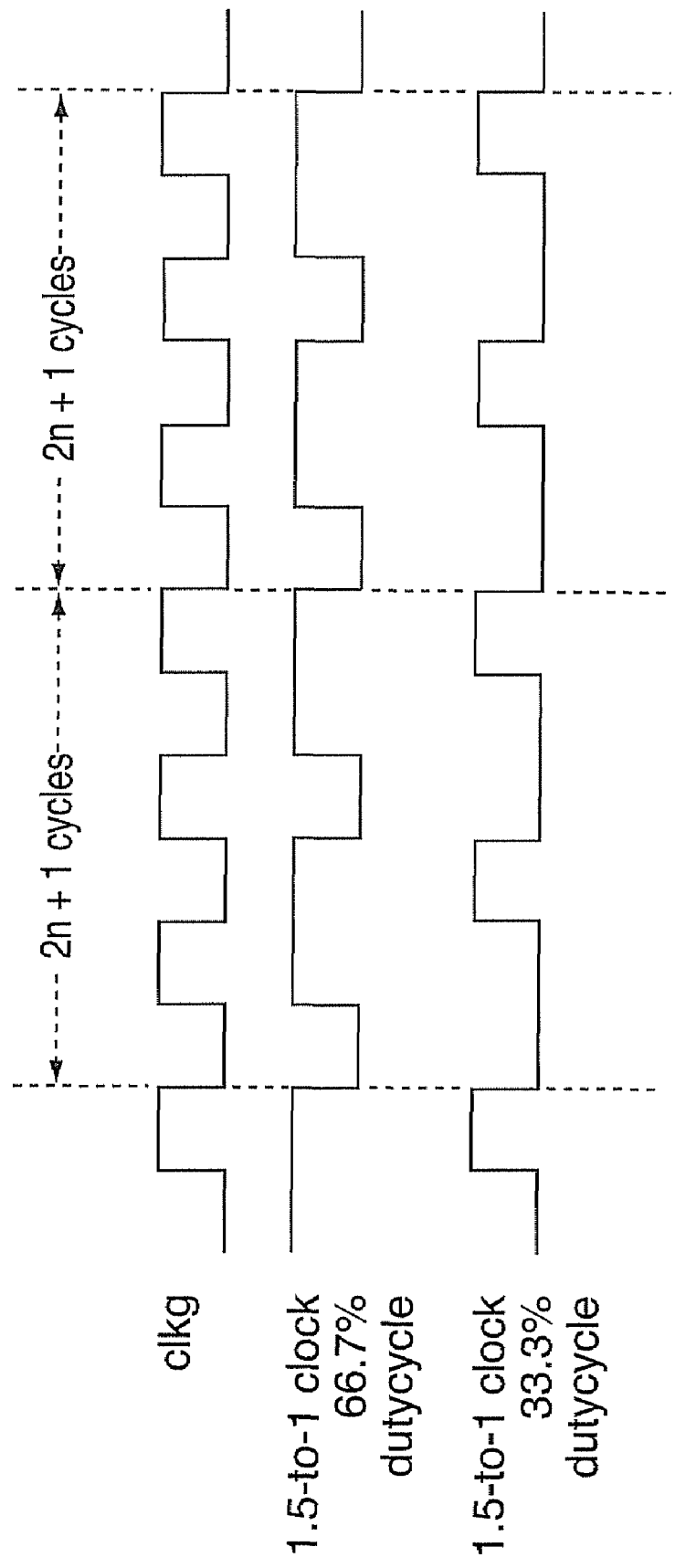
FIG. 12 illustrates one example of timing diagrams of two 1.5-to-1 clocks with different duty cycles.

FIG. 12 illustrates one example of timing diagrams of two 1.5-to-1 clocks with different duty cycle. Since the clock high signal clkl is passed by passgates 44 when the global clock signal clkg is high, the clock high signal clkh needs to be stable when the global clock signal clkg is high. That means that the clock high signal clkh is sourced from an L2 latch having a first phase delay shown in FIG. 10. For the same reason, the clock low signal clkl is sourced from an L1 latch having a second phase delay as shown in FIG. 10.

With the above basic structure, the number of staging latches 36, the control signal pattern generated from the state machine 30 and the combination logic 38 can be manipulated to achieve the intended (n+0.5)-to-1 clock with desired duty cycle. Since the passgates 44 can only switch at rising or falling edges of the global clock clkg, the achievable duty cycle is an increment of 100/(2n+1) %.

FIG. 13 illustrates one example of a method of determining a clock low signal clkl and clock high signal clkh pattern. First, the desired pattern of (n+0.5)-to-1 clock is determined, for example: 1.5-to1 clock with a 66.7% duty cycle. Then, the required clock low signal clkl and clock high signal clkh patterns are determined that will generate the (n+0.5)-to-1 clock. The clock low signal clkl is valid when the global clock signal clkg is low. The clock high signal clkh is valid when global clock signal clkg is high.

Figure 14:
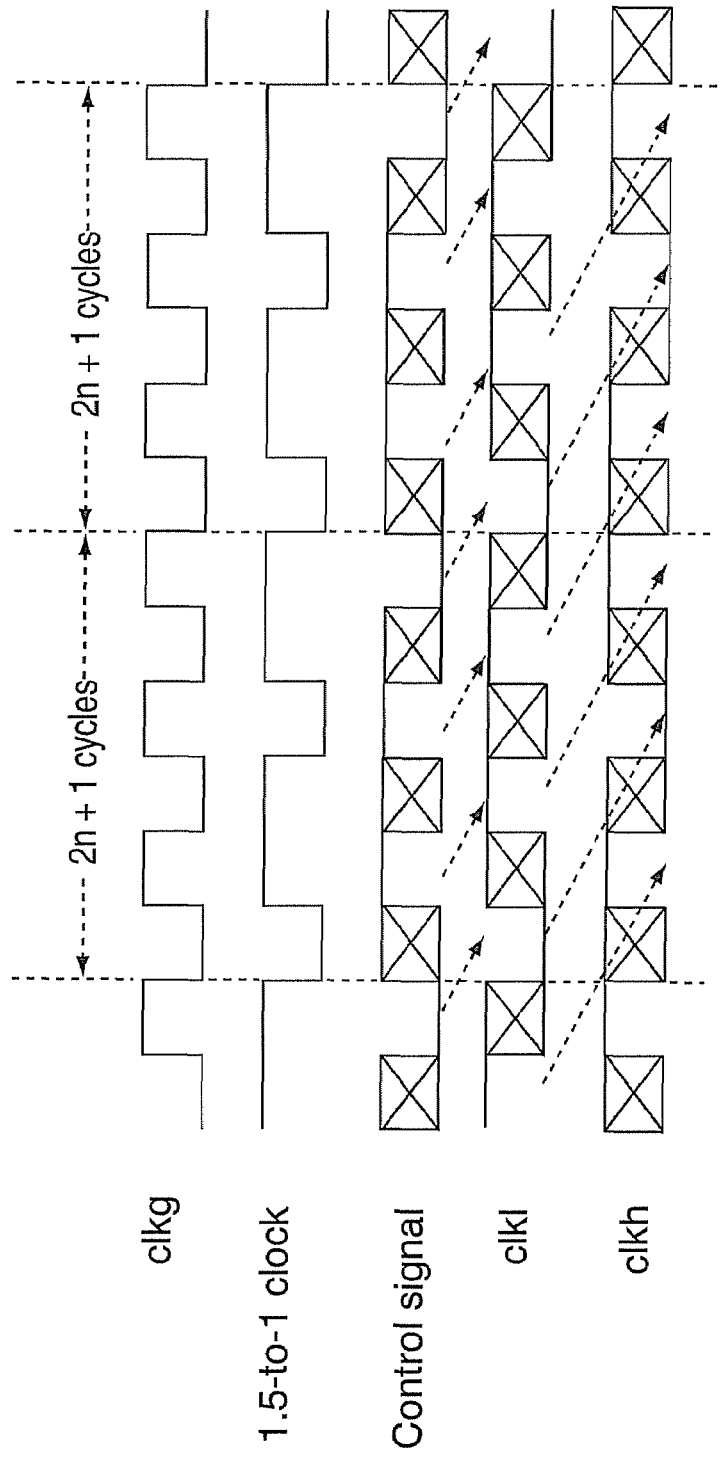
FIG. 14 illustrates one example of determining the timing relationship of clkl and clkh.

FIG. 14 illustrates one example of determining the timing relationship of the clock low signal clkl and the clock high signal clkh. If a two-state-machine option is used as shown in FIG. 8, each state machine 30 will generate the needed clock low signal clkl and clock high signal clkh patterns. No staging latch is required in the embodiments with multiple state machines. If staging latches and logic are used, the relationship between the clock low signal clkl and the clock high signal clkh is determined. A single state machine 30 with staging latches 34 instead of two state machines 30 may be used due to the patterns of the clock low signal clkl and the clock high signal clkh being related. In the example above, the clock low signal clkl has the pattern of 011011, while the clock high signal clkh has 101101. The clock high signal clkh can be obtained by delaying the clock low signal clkl by 1.5 global clock signal clkg cycles.

Figure 15:
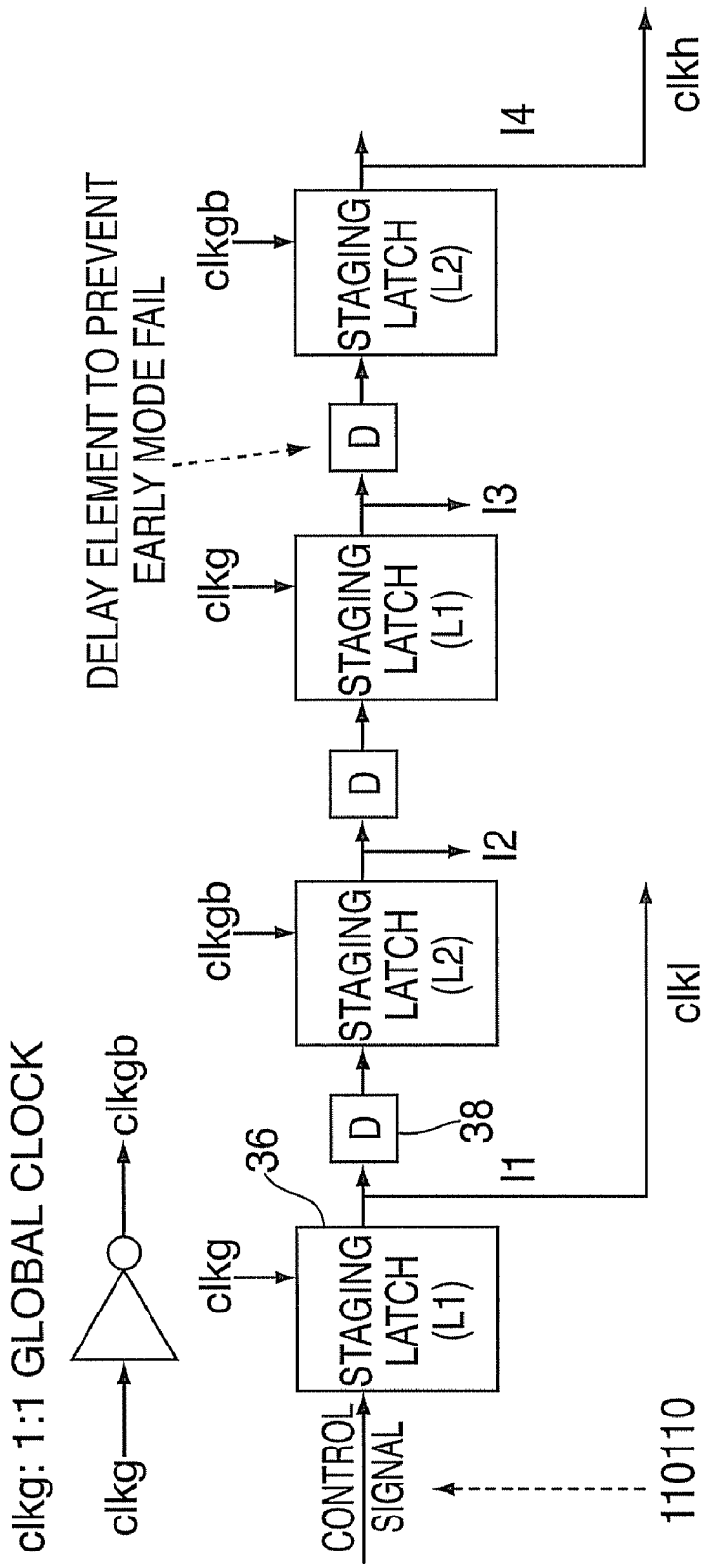
FIG. 15 illustrates one example of a circuit for generating 1.5-to-1 clock with 4 latches.

FIG. 15 illustrate one example of a circuit for generating 1.5-to-1 clock defined in FIG. 13 with 4 latches. The logic circuitry 38 (delay elements in this example), number of staging latches 36, and control signal pattern are selected to generate the clock low signal clkl and the clock high signal clkh. In the example above, the clock low signal clkl will be taken directly from delayed control signal 11, while the clock high signal clkh is taken from delayed control signal 14. No group combination logic 40 is used in this example. A similar structure in FIG. 15 may be used to generate 2.5-to-1 clock by adding two more staging latches. For (n+0.5)-to-1 clock, 2n+2 staging latches may be used.

Figure 16:
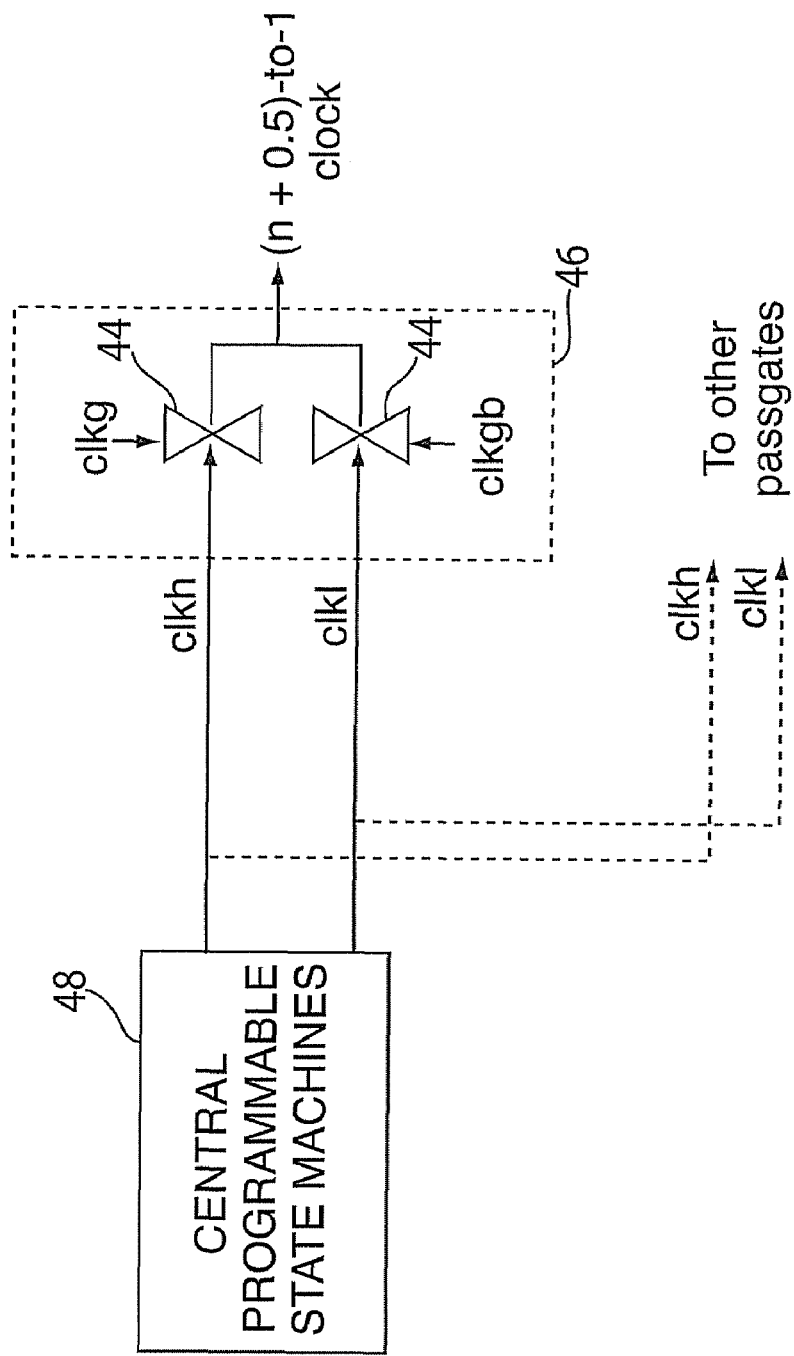
FIG. 16 illustrates centralized programmable state machines and local clock generation circuits.

The staging latch circuit is generally associated with the frequency of the clock to be generated. If the completely centralized approach is taken as shown in FIG. 16, the local clock generation circuits 46 only contain passgates 44. The frequency and duty cycle of the generated clock become completely programmable by controlling the state machines 48 in the central clock control unit. This may be a solution of choice if complete programmability of the ratio clock is desired.

The table below shows examples of generating different ratio clocks with different clock low signal clkl and clock high signal clkl patterns. Any n/2 clock may be generated by changing the clock low signal clkl and the clock high signal clkh generated from the central state machines. The change of frequencies can even be done dynamically during chip operations.

| clkl | clkh | ratio clock |
| --- | --- | --- |
| 000000 | 111111 | 1-to-1 |
| 111111 | 000000 | 1-to-1 inverted |
| 011011 | 101101 | 1.5-to-1 |
| 010101 | 111111 | 2-to-1 |
| 01111 | 11011 | 2.5-to-1 |

Figure 17:
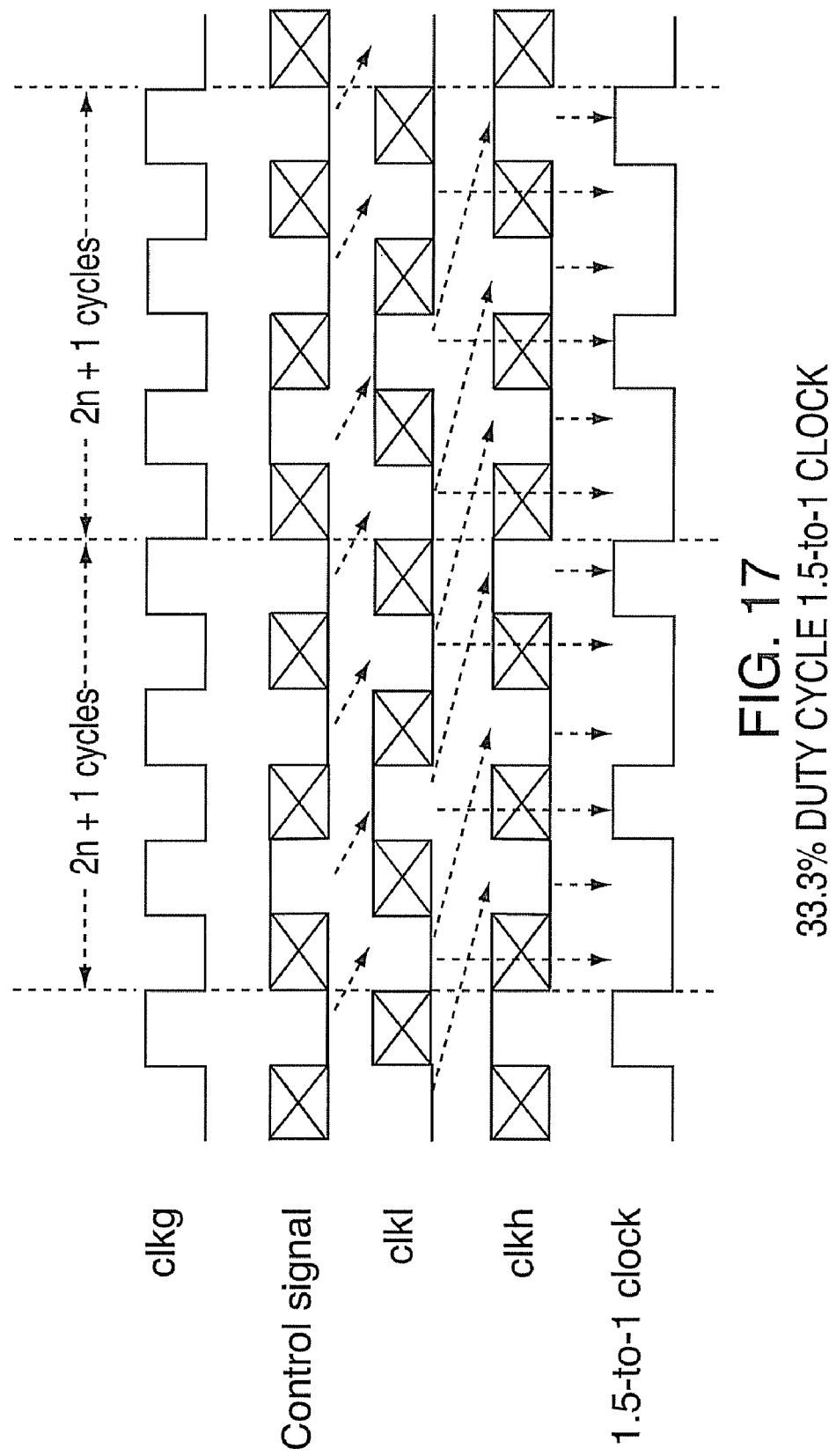
FIG. 17 illustrates one example of a 1.5-to1 clock with 33.3% duty cycle.
Figure 19:
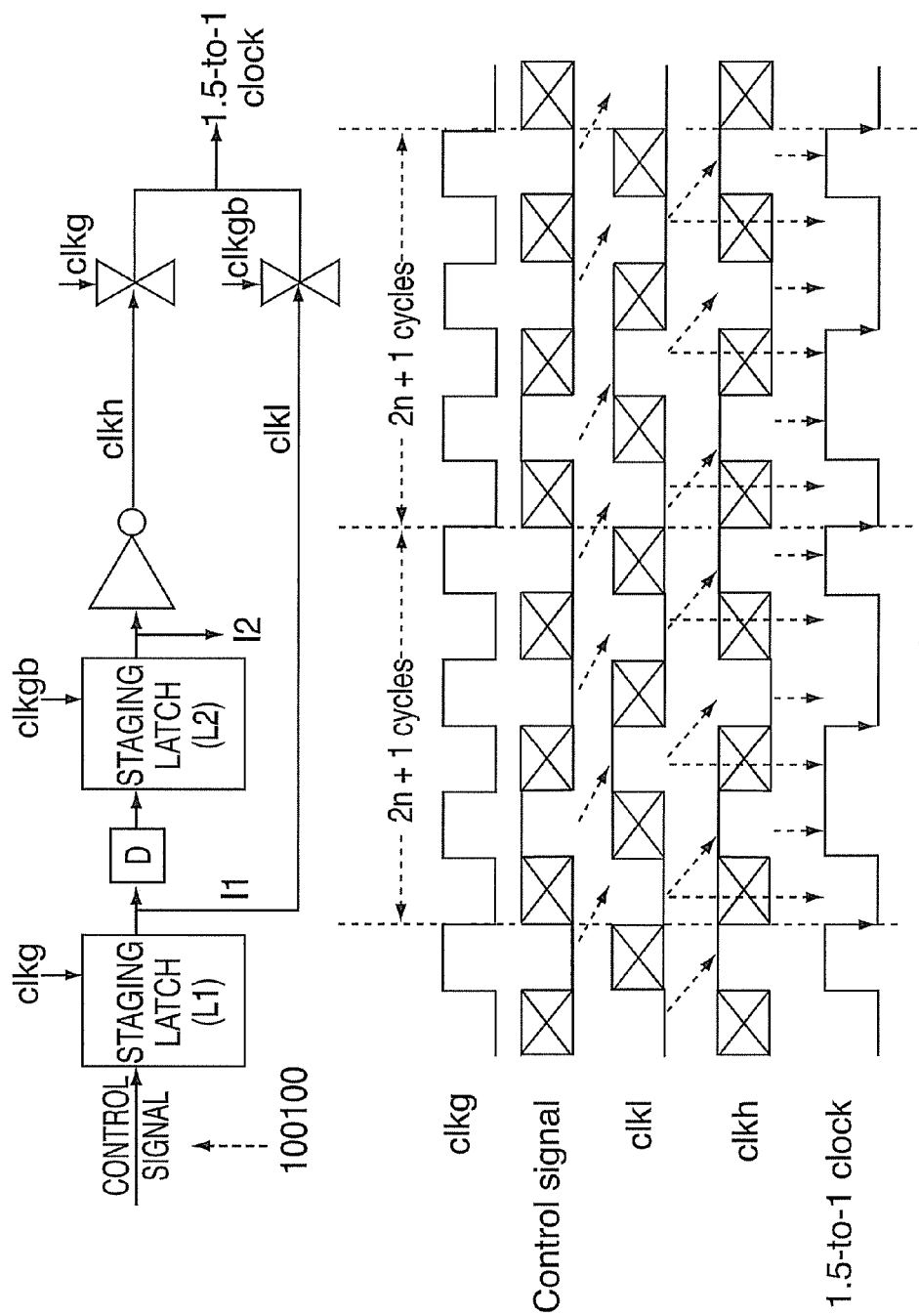
FIG. 19 illustrates one example of a circuit for generating 1.5-to-1 clock with 2 latches and the associated timing diagram.

FIG. 17 illustrate one example of a 1.5-to1 clock with 33.3% duty cycle. With the staging latch circuit shown in FIG. 15, the input control signal may be used to control the duty cycle of (n+0.5)-to-1 clock. Since there is no change to the staging latch circuit, this can be achieved by reconfiguring or controlling the centralized state machine. FIG. 19 shows an example with an input control signal pattern of 100100 to alter the duty cycle.

Figure 18:
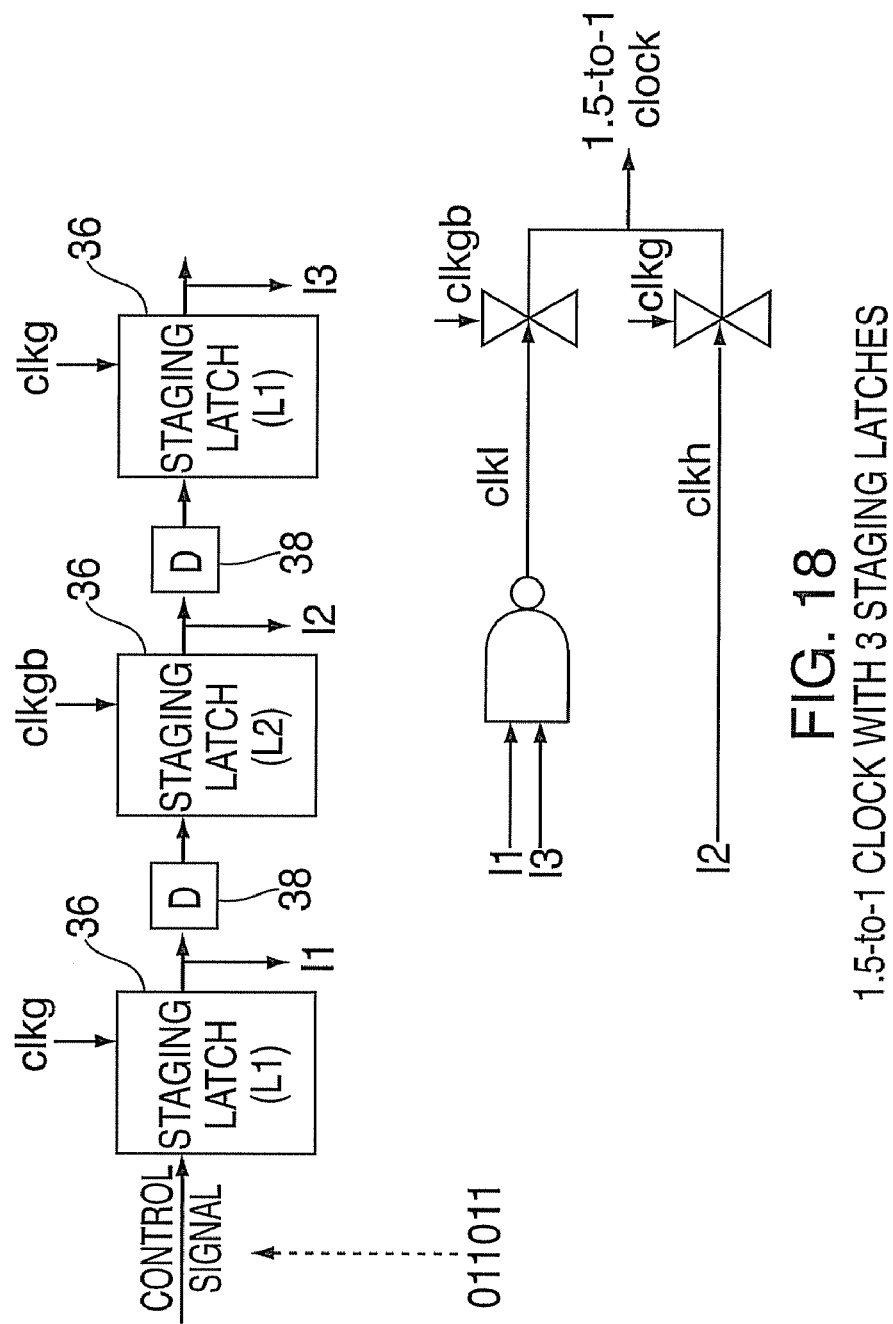
FIG. 18 illustrates one example of a circuit for generating 1.5-to-1 clock with 3 latches.

FIG. 18 illustrates one example of a circuit for generating a 1.5-to-1 clock with 3 latches. If the staging latches and logic reside inside the local clock generation circuit, further compaction of the circuit may be desired to save area. Extra logic may be added to the combination logic part to reduce the number of staging latches required. The extra logic required depends on the intended frequency and duty cycle of (n+0.5)-to-1 clock. The example in FIG. 18 shows 1.5-to-1 clock implementation with only 3 staging latches 36.

FIG. 19 illustrate one example of a circuit for generating 1.5-to-1 clock with 2 latches and the associated timing diagram. This provides an even more compact circuit, using only 2n staging latches to generate (n+0.5)-to-1 clock if only the falling or rising of the edge of the clock is important and it's acceptable to have varying duty cycle on the generated clock.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for locally generating a ratio clock on a chip, comprising:

generating a global clock signal having a global clock cycle;

providing a centralized state machine, the state machine including a counter going through a complete cycle in response to a non-integer number of global clock cycles, the state machine generating a control signal in response to the counter, the control signal being provided to multiple local clock generation circuits;

providing the control signal to staging latches, the staging latches generating a clock high signal and a clock low signal, providing local pass gate for generating an (n+0.5)-to-1 clock signal in response to the global clock signal, the clock high signal and the clock low signal.

2. The method of claim 1 wherein the state machine is partially centralized.

3. The method of claim 1 wherein the clock high and clock low signal have patterns derived from a waveform of a target divided ratio clock, the clock high and clock low signals have patterns that match the targeted divided clock frequency and duty cycle.

4. The method of claim 1 wherein the clock low signal and clock high signal are determined from a target ratio clock.

5. The method of claim 1 wherein the staging latches are localized staging latches being part of local clock generation circuits.

6. The method of claim 1 wherein the staging latches are partially centralized staging latches providing the clock high signal and the clock low signal to a plurality of local clock generation circuits.

7. The method of claim 1 wherein the state machine and the staging latches are partially centralize such that each state machine and staging latches providing the clock high signal and the clock low signal to a portion of local clock generation circuits on the chip.

8. The method of claim 1 wherein the state machine and the staging latches are arranged in a hierarchy, the state machine providing control signals to a plurality of partially centralized staging latches, each staging latch providing the clock high signal and the clock low signal to a portion of local clock generation circuits on the chip.

9. The method of claim 1 wherein the staging latches are localized staging latches being part of local clock generation circuits and the state machine is partially centralized such that multiple state machines provide control signals to groups of local clock generation circuits.

10. The method of claim 1 wherein the frequency and duty cycle of the ratio clock may be dynamically changed without changing the designs of local circuiting by selecting patterns for the clock low signal and the clock high signal.

11. A method for locally generating a ratio clock, comprising:

generating a global clock signal having a global clock cycle;

providing a centralized clock control unit including a first state machine and a second state machine, the first state machine including a counter going through a complete cycle in response to a non-integer number of global clock cycles, the first state machine generating a clock high signal having a pattern corresponding to a target divided ratio clock when the global clock is high;

providing the second state machine with a counter going through a complete cycle in response to a non-integer number of global clock cycles, the second state machine generating a clock low signal having a pattern corresponding to the target divided ratio clock when the global clock is low;

providing local pass gate for generating an (n+0.5)-to-1 clock signal in response to the global clock signal, the clock high signal and the clock low signal.

12. The method of claim 11 wherein the state machine is partially centralized.

* * * * *